United States Patent
Chung et al.

(10) Patent No.: US 6,919,513 B2
(45) Date of Patent: Jul. 19, 2005

(54) FILM CARRIER TAPE FOR SEMICONDUCTOR PACKAGE AND MANUFACTURING METHOD THEREOF

(75) Inventors: Ye-Chung Chung, Suwon (KR); Si-Hoon Lee, Asan (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/621,376

(22) Filed: Jul. 18, 2003

(65) Prior Publication Data

US 2004/0017001 A1 Jan. 29, 2004

(30) Foreign Application Priority Data

Jul. 24, 2002 (KR) .................................. 10-2002-0043541
May 7, 2003 (KR) .................................. 10-2003-0028980
May 17, 2003 (KR) .................................. 10-2003-0031400

(51) Int. Cl.[7] .......................... H05K 1/03; H01L 23/495
(52) U.S. Cl. ...................... 174/255; 174/52.4; 257/668; 257/674; 257/701; 257/723; 438/110; 438/125; 438/464; 428/192
(58) Field of Search ................................ 428/192, 209, 428/125, 464; 174/52.4, 254–255; 257/668, 701, 723; 438/110, 113

(56) References Cited

U.S. PATENT DOCUMENTS

| | | | | |
|---|---|---|---|---|
| 5,345,039 A | * | 9/1994 | Yamazaki | 174/52.4 |
| 6,320,135 B1 | * | 11/2001 | Saito | 174/250 |
| 6,509,630 B1 | * | 1/2003 | Yanagisawa | 257/668 |
| 6,740,966 B2 | * | 5/2004 | Nakamura | 257/701 |

* cited by examiner

*Primary Examiner*—Cathy F. Lam
(74) *Attorney, Agent, or Firm*—Harness, Dickey & Pierce P.L.C.

(57) ABSTRACT

A film carrier tape and a method of forming a film carrier tape that incorporates a polymeric reinforcement film are provided for decreasing the deformation of and damage to film carrier tapes by forces resulting from contact with sprocket teeth during the semiconductor assembly process. The reinforcement film may include one or more synthetic resins and may increase the useable area of a base film used in forming film carrier tapes.

18 Claims, 7 Drawing Sheets

(CONVENTIONAL ART)

FILM CARRIER TAPE FOR SEMICONDUCTOR PACKAGE AND MANUFACTURING METHOD THEREOF

BACKGROUND OF THE INVENTION

This U.S. nonprovisional patent application claims priority under 35 U.S.C. § 119 from Korean Patent Application 2002-43541, filed Jul. 24, 2002, Korean Patent Application 2003-28980, filed May 7, 2003, and Korean Patent Application 2003-31400 filed May 17, 2003, the entire contents of which are hereby incorporated by reference.

1. Field of the Invention

The present invention relates to a film carrier tape for a semiconductor package and a manufacturing method thereof and, more particularly, a film carrier tape having a reinforcing film for increasing the strength of the film carrier tape.

2. Description of the Prior Art

As electronic devices become miniaturized and multifunctional, the semiconductor packages used in the electronic devices also need to be smaller. Several types of packages have been developed in response to this demand including tape carrier packages (TCP) and chip-on-film packages (COF). Both tape carrier packages and chip-on-film packages are manufactured using a thin film rather than a lead frame or a printed circuit board (PCB) for mounting the semiconductor chips. For mass production of TCP or COF, a film carrier tape on which a plurality of packages may be formed is typically used.

Figure 1:
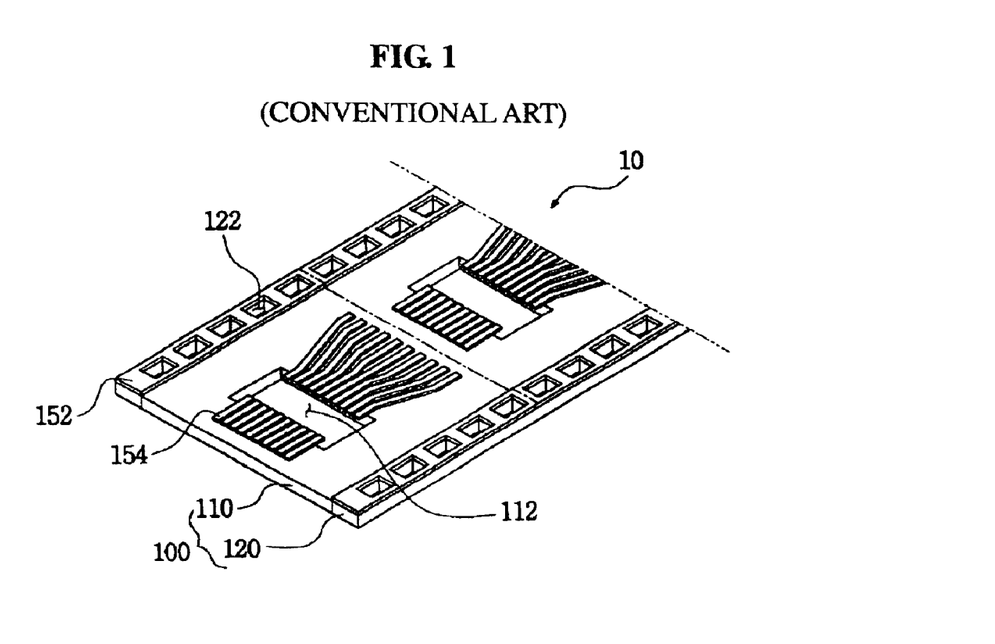
FIG. 1 shows a conventional film carrier tape with a reinforcement metal pattern.

The structure of a conventional film carrier tape will be described with reference to FIGS. 1–3. FIG. 1 is a perspective view of a conventional film carrier tape (10) comprising a base film (100), a wiring pattern (154) formed on the upper side of the base film (100) and a reinforcement metal pattern (152). The base film (100) comprises a main area (110) through which a chin installation hole 112 is formed and on which the wiring pattern (154) is formed, and a peripheral area (120) on which a plurality of sprocket holes (122) is formed.

The sprocket holes (122) are used for transporting the film carrier tape by a rotating sprocket. The reinforcement metal pattern (152) is formed on the peripheral area (120) of the base film (100) to reduce the likelihood that the sprocket holes (122) will be torn by the sprocket teeth (not shown), and to enhance the strength of the base film (100). The base film (100) is usually made of one or more layers of synthetic resin such as polyimide, and may have a thickness of about 38 μm.

The wiring pattern (154) and the reinforcement metal pattern (152) are usually made of conductive metals such as copper (Cu), and may have a thickness of about 8 μm. The wiring pattern (154) and the reinforcement metal pattern (152) can be made by patterning and etching a thin metal layer formed on the base film (100).

In a typical manufacturing process, a film carrier tape having two or more lanes of films may be used to enhance the efficiency of the manufacturing process. FIG. 2 is a perspective view showing a film carrier tape having two lanes of film that can be used in a conventional manufacturing process.

Figure 2:
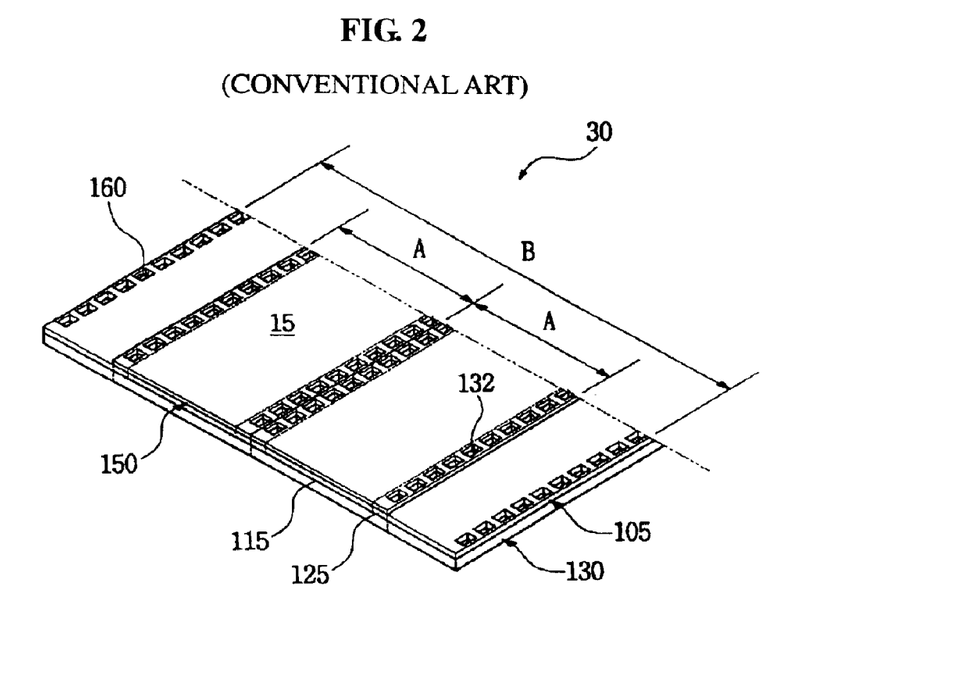
FIG. 2 shows a conventional film carrier tape on which two lanes of films are formed.

As shown in FIG. 2, each of the lane's film (15) has a width (A), typically 35 mm, and are formed on a film carrier tape (30) having a width (B), typically 105 mm, for use in the conventional manufacturing process.

The metal layer (150) which will be patterned and etched to form the wiring pattern and the reinforcement metal pattern is formed on the upper surface of a base film (105). A supplementary film (130) may be attached to the lower surface of the base film (105).

In order to form the uniform reinforcement metal pattern and the wiring pattern, a liquid photoresist needs to be applied evenly across the metal layer (150) on the base film (105). However, the liquid photoresist applied on the outermost peripheral areas of the film carrier tape (30) runs down through the outermost sprocket holes (160) which were formed before the patterning and etching process to provide for the transfer of the film carrier package. Therefore, the area of base film (105) near the sprocket holes (160) cannot be used and are wasted. The sprocket holes (132) of each lane of the films (15) are formed after the photoresist becomes hardened. Therefore, although three lanes of film could be formed on the film carrier tape given the typical widths of each lane of the film (15) and the film carrier tape (30), only two lanes of film can be formed on the film carrier tape in the conventional manufacturing process.

The supplementary film (130) usually includes one or more synthetic resins such as polyethylene terephthalate (PET), and may have a thickness of about 50 μm. After manufacturing the film carrier tape (30), the supplementary film (130) may be removed from the lower surface of the base film (105).

A solder resist layer is usually formed on the metal layer (150) of the film carrier tape (30), to a thickness of about 12 μm in order to reduce oxidization of the metal layer (150).

Figure 3:
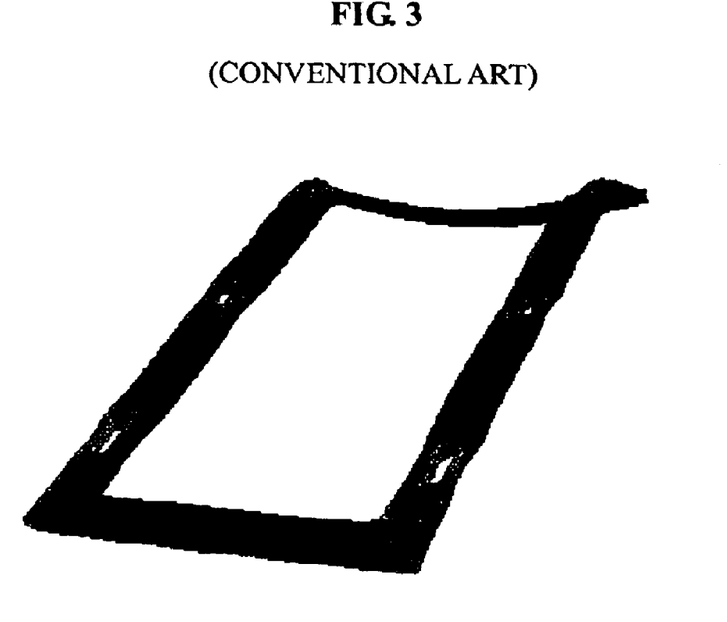
FIG. 3 shows the graphic results of a computer simulation of the deformation of a conventional film carrier tape with a reinforcement metal pattern.

FIG. 3 shows the result of a computer simulation of the deformation of the conventional film carrier tape under pressure. As shown in FIG. 3, the deformation of the film carrier tape is greatest near the surface on which the sprocket directly exerts force despite the reinforcement metal pattern provided on the peripheral area of the film.

In addition, the sprocket holes may be easily torn by the sprocket, because the reinforcement of the reinforcement effect of the conventional reinforcement metal pattern is not sufficient.

In addition, a large amount of films are wasted for forming the reinforcement metal pattern by the above-describe reason.

SUMMARY OF THE INVENTION

Exemplary embodiments of the invention provide a film carrier tape having an improved reinforcement structure and a method for manufacturing such a film carrier tape.

An exemplary film carrier tape according to the invention comprises a base film and a reinforcement film. The base film has a main area where a wiring pattern is formed and a peripheral area where a plurality of sprocket holes are formed. The reinforcement film reinforces the base film attached to the peripheral area of the base film and is formed from a material that is different than the material used to form the wiring pattern. The wiring pattern of an exemplary embodiment may be formed on an upper surface of the base film, and the reinforcement film may be attached to a lower surface of the base film. The reinforcement film may be made from one or more synthetic resins and may include a resin selected from a group consisting of polyethylene terephthalate, liquid crystalline polymer, polytetrafluoroethylene, polypropylene, polyethylene, polyamide-66, and polycarbonate. The reinforcement film may have a thickness of 20–80 μm and may include sprocket holes formed through the reinforcement film.

An exemplary method of manufacturing such a film carrier tape comprises (a) attaching a raw film to a base film having a main area and a peripheral area, (b) forming a plurality of sprocket holes on the peripheral area of the base film, (c) forming a wiring pattern on the main area of the base film, (d) cutting the raw film along a boundary between the main area and the peripheral area of the base film, and (e) forming a reinforcement film by removing the portion of the raw film corresponding to the main area of the base film. In another exemplary embodiment, the raw film may be cut (step (d)) before the wiring pattern is formed on the base film (step (c)). Similarly, the raw film may be attached to the lower surface of the base film, and the wiring pattern may be formed the upper surface of the base film.

The raw film may be made from one or more synthetic resins and may include a resin selected from a group consisting of polyethylene terephthalate, liquid crystalline polymer, polytetrafluoroethylene, polypropylene, polyethylene, polyamide-66, and polycarbonate. The raw film may have a thickness of 20–80 $\mu$m or may be manufactured to provide raw films of other ranges of thickness depending on the application and the materials selected.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF EXAMPLARY EMBODIMENT

Figure 4:
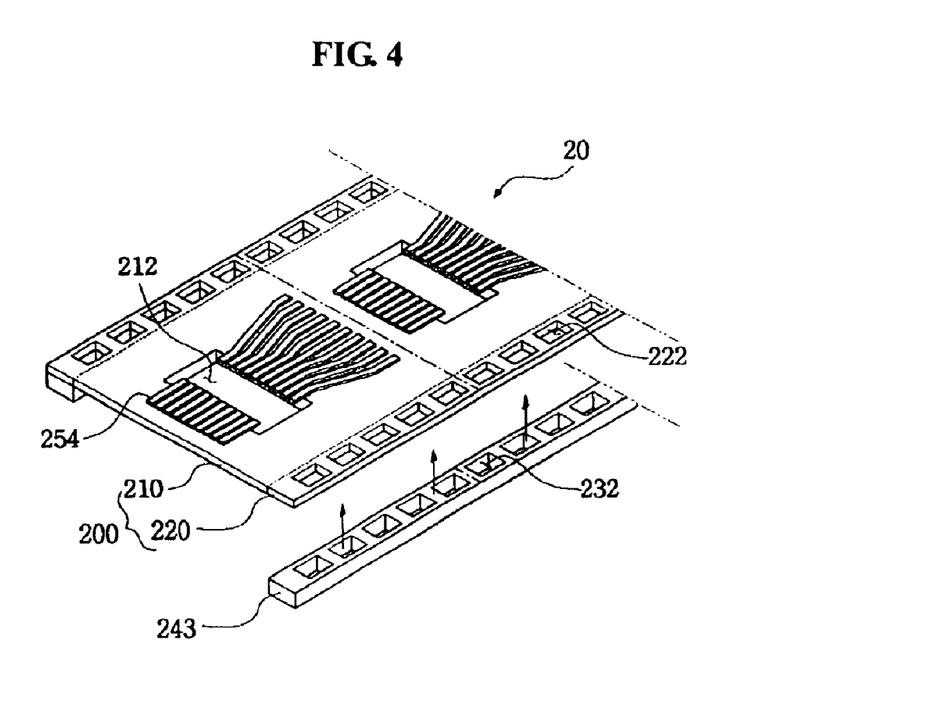
FIG. 4 shows a film carrier tape with a reinforcement film according to an exemplary embodiment of the invention.

An exemplary film carrier tape and an exemplary method for manufacturing such a film tape carrier according to the present invention will be described referring to FIGS. 4–10. FIG. 4 shows a film carrier tape with a reinforcement film attached to the lower surface of the base film. As shown in FIG. 4, the film carrier tape comprises a base film (200), a wiring pattern (254) and a reinforcement film (243). As with the conventional film carrier tape, the base film (200) comprises a main area (210) on which the wiring pattern is formed and a peripheral area (220) where a plurality of sprocket holes (222) are formed. The reinforcement film (243) is attached to the lower surface of the peripheral area (220) and has a plurality of sprocket holes (232) corresponding to and aligned with the sprocket holes (222) of the base film (200).

The base film (200) may be made from one or more synthetic resins such as liquid crystalline polymer (LCP), polyetheretherketone (PEEK), or preferably polyimide (PI). The base film (200) may have a thickness of 25–50 $\mu$m and may have a typical thickness of about 38 $\mu$m.

The wiring pattern (254) is made of conductive metal such as aluminum (Al), silver (Ag), copper (Cu), or an alloy of one or more of these metals. The wiring pattern (254) may have a typical thickness of 6–8 $\mu$m and may be formed by patterning and etching a metal layer formed on the main area (210) of the base film (200). A chip installation hole (212), where a chip will be installed, may be formed on the main area (210) of the base film (200).

The reinforcement film (243) may be made of a synthetic resin such as liquid crystalline polymer (LCP), polytetrafluoroethylene (PTFE), polypropylene (PP), polyethylene (PE), polyamide 66 (PA-66), polycarbonate (PC), or more preferably polyethylene terephthalate (PET). The reinforcement film (243) usually may have a thickness of 20–80 $\mu$m and more typically about 50 $\mu$m.

TABLE 1 shows the characteristics of selected synthetic resins that may be used for the reinforcement film (243).

TABLE 1

|  | PI | LCP | PTFE | PP | PE | PET | PA-66 | PC |
|---|---|---|---|---|---|---|---|---|
| Heat Resistance | V | V | G | N | N | N | N | N |
| Cost | P | G | G | V | V | V | V | V |

V: very good G: good N: normal P: poor

As seen from TABLE 1, several kinds of synthetic resins can be used for the reinforcement film (243). PET, for example, provides an acceptable combination of cost and material characteristics for a reinforcement film.

The reinforcement film (243) may be attached to the base film (200) using an acryl or epoxy type adhesive layer of 5–15 $\mu$m. The sprocket holes (222) of the base film (200) and the sprocket holes (232) of the reinforcement film (243) will typically be aligned with each other. A solder resist layer of 5–20 $\mu$m may be formed on the wiring pattern (254) for reducing the oxidization of the wiring pattern (254).

The invention may be adapted to film carrier tape having more than two lanes of film, in order to enhance the efficiency of the manufacturing process.

Figure 5:
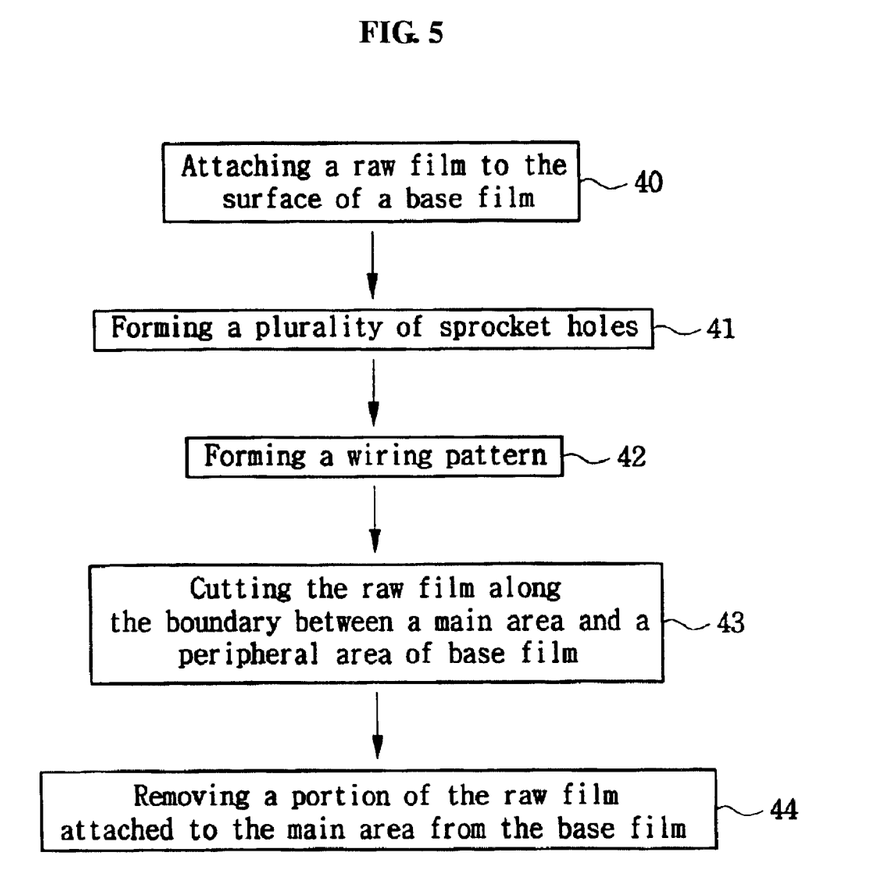
FIG. 5 is a block diagram showing the manufacturing process of an exemplary reinforcement film.

FIG. 5 is a flow chart illustrating an exemplary manufacturing process for producing an exemplary film carrier tape according to the invention. FIGS. 6–9 illustrate the construction of a film carrier tape according to the manufacturing steps (40–44) identified in FIG. 5. Each manufacturing step of the film carrier tape will be described with reference to FIGS. 5–9.

Figure 6:
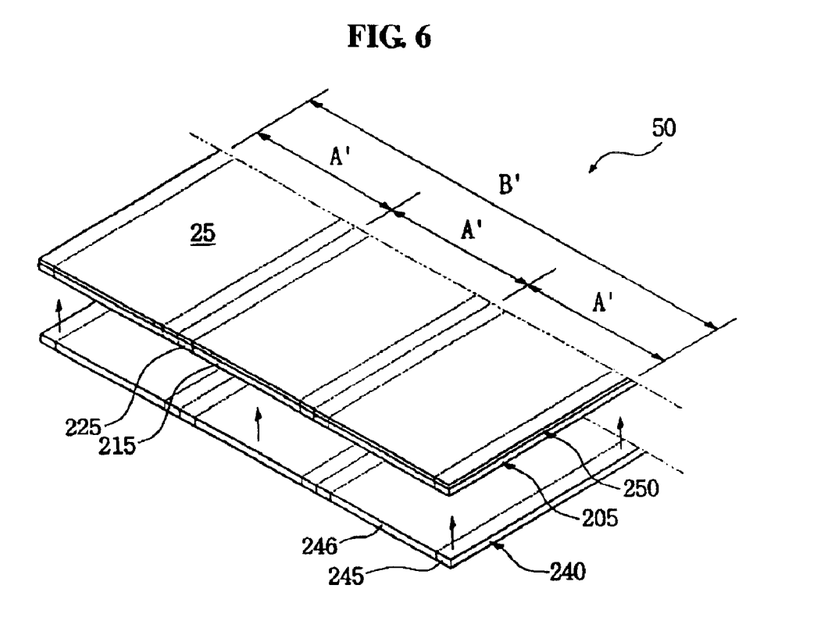
FIG. 6 shows an exemplary process in which a raw film is attached to a base film.

As shown in FIG. 6, the metal layer (250) is formed on the upper surface of the base film (205). A raw film (240) supports the base film (205) is attached to the lower surface of the base film (205) as reflected in step (40) of FIG. 5. In this embodiment, three lanes of film (25) of width (A') are formed on the film carrier tape (50) whose width (B') is three times (A'). The width of the raw film (245) is typically the same as that of the film carrier tape (50).

Figure 7:
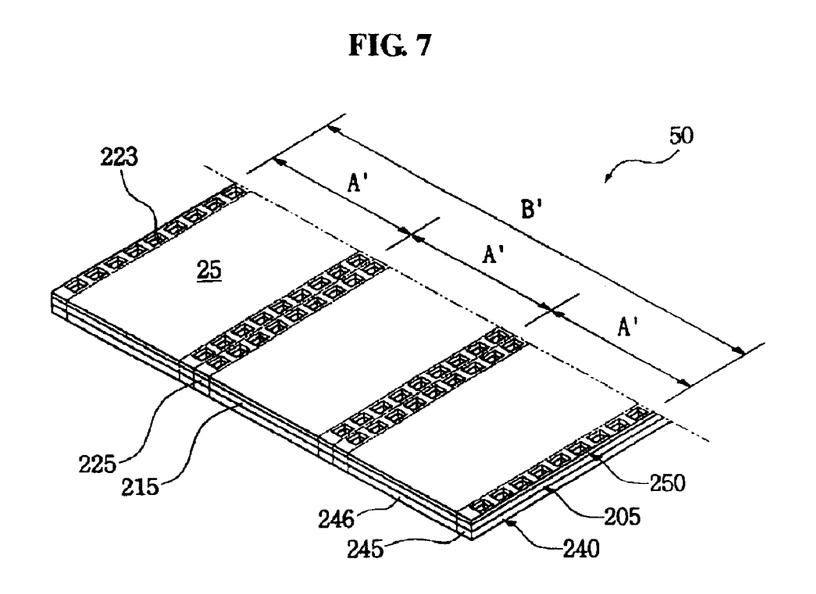
FIG. 7 shows an exemplary process in which a plurality of sprocket holes are formed on the base film and the raw film.

After the raw film is attached to the base film (205), sprocket holes (223) are formed through the base film and the raw film (240) by perforating the base film and the raw film simultaneously as shown in FIG. 7 and reflected in step (41) of FIG. 5. The sprocket holes (223) are formed on the outmost area of the film carrier tape (50) and are used for transferring the film carrier tape using a sprocket.

Figure 8:
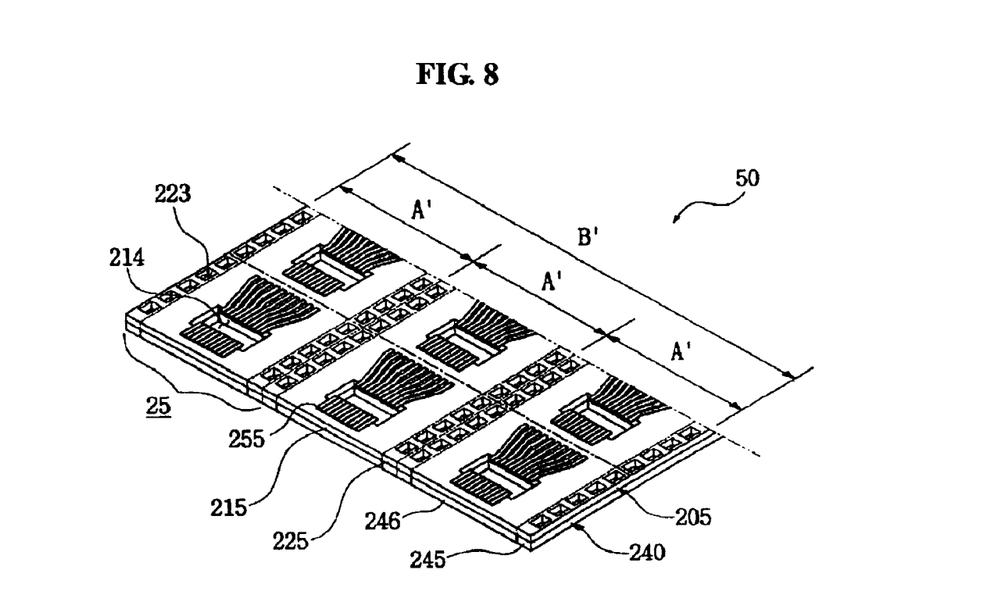
FIG. 8 shows an exemplary process in which a wiring pattern is formed on the base film.

After the sprocket holes (223) are formed, the wiring pattern (255) is formed on the base film (205) as shown in FIG. 8 and reflected in step (42) of FIG. 5. In the step (42), a chip installation hole (214) where a semiconductor chip can be positioned may also be formed. The wiring pattern (255) may be manufactured by patterning and etching the metal layer (250) provided on the base film (205).

After the wiring pattern (255) is formed on the base film (205), the raw film (240) is cut along the boundary between the main area (215) and the peripheral area (225) of the base film (205) as reflected in step (43) of FIG. 5. The step (43) may also be performed before step (42).

Figure 9:
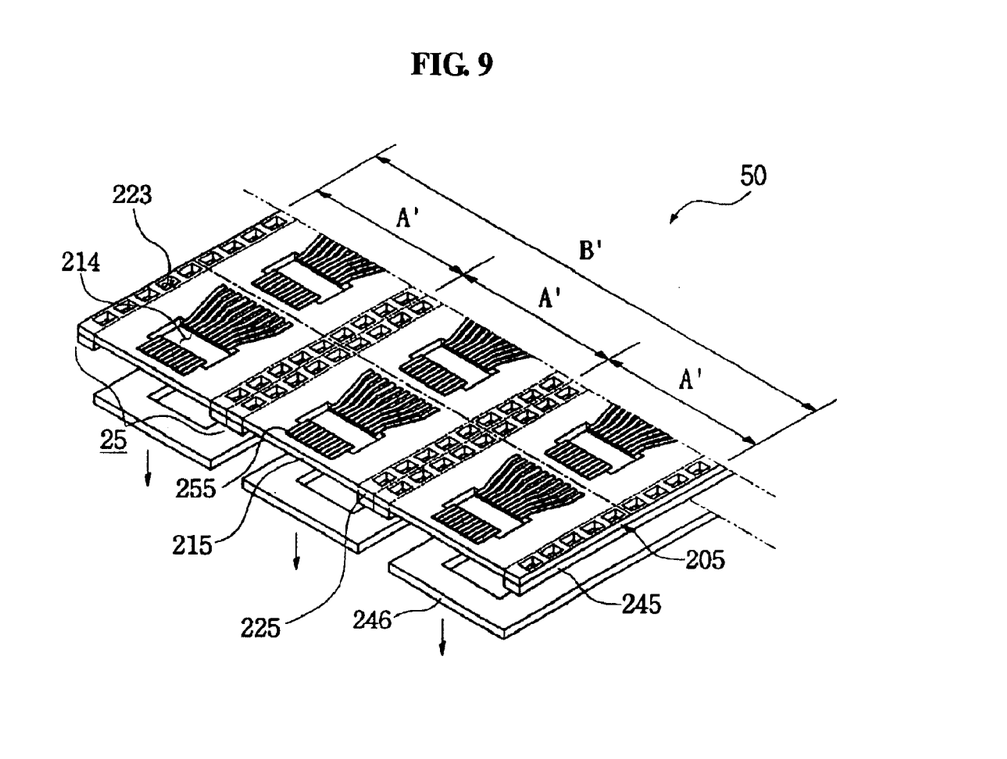
FIG. 9 shows an exemplary process in which a portion of the raw film attached to the main area is removed from the base film.

After the raw film (240) is cut, the portion (246) of the raw film (240) attached to the main area (215) of the base film (205) is removed from the base film (205) as shown in FIG. 9 and as reflected in step (44) of FIG. 5. The remaining portion of the raw film (240) attached to the peripheral area (225) remains to form the reinforcement film (245).

According to the described embodiment of the present invention, the reinforcement film (245) is used instead of a conventional reinforcement metal pattern to strengthen the film carrier tape (50). Therefore, the liquid photoresist may be applied only on the main area (215) of the base film (205) during the manufacturing process. By removing the need to apply the liquid photo resist on the peripheral areas (225) of the base film (205), the problems associated with photoresist running down through the sprocket holes (223) are reduced or eliminated, and the outermost sprocket holes can be used as the sprocket holes of an outer lane of film. As a result, the utilization of the base film (205) may be improved when compared with the conventional technology by using the reinforcement film (245) disclosed in the exemplary embodiment of the present invention.

After all steps for manufacturing the reinforcement film (245) are finished, the film carrier tape (50) may be divided into three individual reinforced film carrier tapes with each divided film carrier tape available for a semiconductor package manufacturing process.

Figure 10:
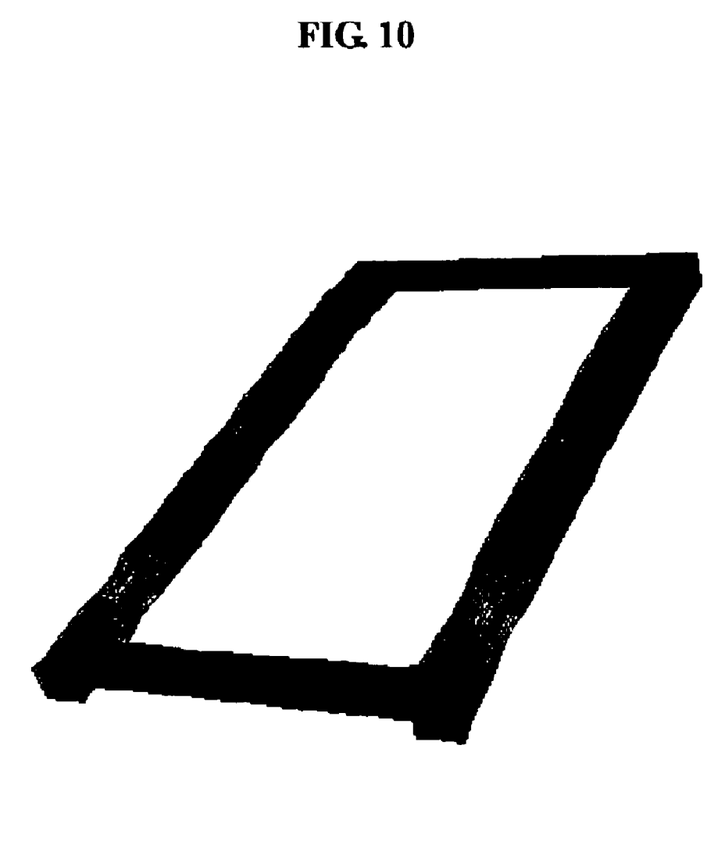
FIG. 10 shows the results of a computer simulation of the deformation of the improved film carrier tape with a reinforcement film according to an exemplary embodiment of the invention.

FIG. 10 shows the result of a computer simulation of the deformation of the improved film carrier tape of the present invention under pressure.

Compared with the simulation result of the conventional technology using the traditional reinforcement metal pattern shown in FIG. 3, the deformation of the film carrier tape caused by an identical force applied by a sprocket is reduced. The reinforcing effect of the present invention is improved compared to that of the conventional technology and will reduce the likelihood of damage caused by the sprocket during a manufacturing operation.

Figure 11A:
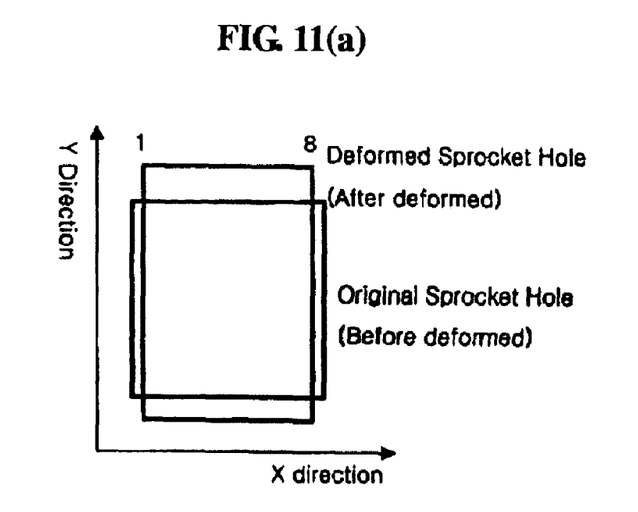
FIGS. 11(a) and 11(b) show the deformation of the sprocket hole caused by the sprocket.
Figure 11B:
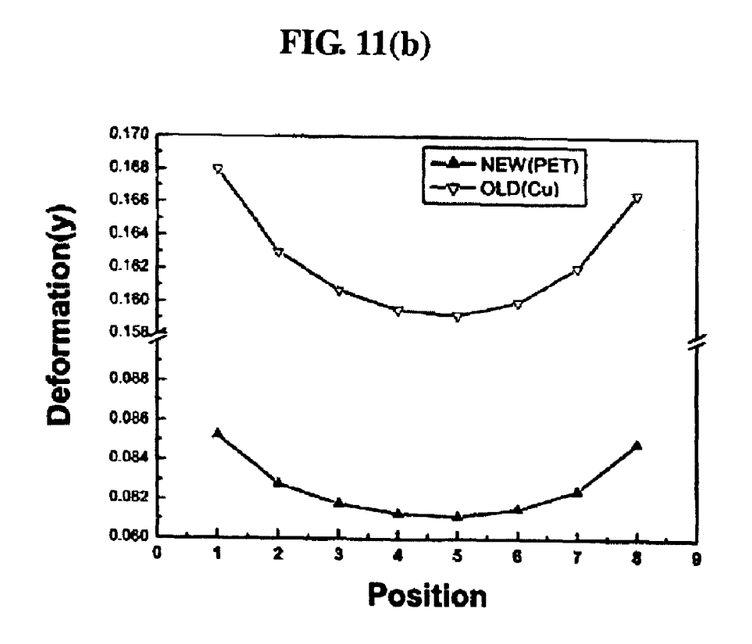

FIGS. 11(a) and 11(b) show the deformation of sprocket holes caused by the sprocket. FIG. 11(a) shows the shapes of sprocket hole before and after the deformation. In order to describe the deformation pattern of the sprocket holes, the deformation was measured at 8 equi-spaced positions along the X-direction in FIG. 11(a). FIG. 11(b) shows the deformation of the sprocket holes at the above-described 8 equi-spaced positions. As shown in FIG. 11(b), the deformation of the sprocket hole according to the present invention is much smaller than that according to the conventional art using the reinforcement metal pattern made of Cu.

Although a certain preferred embodiment of the present invention has been shown and described in detail, it should be understood that various changes and modifications may be made therein without departing from the scope of the appended claims.

What is claimed is:

1. A film carrier tape comprising:
    a base film, the base film formed of a first material and including a main area on which a wiring pattern is formed and a peripheral area; and
    a reinforcement film formed of an insulating second material, the second material comprising a synthetic resin and the reinforcement film being provided on the peripheral area of the base film; wherein
    a plurality of sprocket holes formed through the reinforcement film and the peripheral area of the base film.

2. A film carrier tape according to claim 1, wherein:
    the base film has a upper surface and a lower surface, and further wherein
    the wiring pattern is formed in the main area on the upper surface of the base film, and
    the reinforcement film is attached to the lower surface of the base film.

3. A film carrier tape according to claim 1, wherein:
    the synthetic resin includes at least one substance selected from a group consisting of polyethylene terephthalate, liquid crystalline polymer, polytetrafluoroethylene, polypropylene, polyethylene, polyamide-66 and polycarbonate.

4. A film carrier tape according to claim 3, wherein:
    the synthetic resin includes a major portion of polyethylene terephthalate.

5. A film carrier tape according to claim 1, wherein:
    the reinforcement film has a thickness of 20–80 µm.

6. A film carrier tape according to claim 5, wherein:
    the base film has a thickness of 25–50 µm.

7. A film carrier tape comprising:
    a base film, the base film formed of a first material and including a main area on which a wiring pattern is formed and a peripheral area; and
    a reinforcement film formed of an insulating second material, the second material comprising a synthetic resin and the reinforcement film being provided on only the peripheral area of the base film; wherein
    a plurality of sprocket holes formed through the reinforcement film and the peripheral area of the base film.

8. A film carrier tape according to claim 7, wherein:
    the base film is formed from an insulating first material, has a main region and a peripheral region at least partially surrounding the main region, and has an upper surface and a lower surface;
    the wiring pattern is formed on the upper surface of the base film in the main region; and
    the reinforcement film remains only on the lower surface of the base film in the peripheral region.

9. A film carrier tape according to claim 8, wherein:
    a solder resist layer is provided on the wiring pattern.

10. A method of manufacturing a film carrier tape comprising:
    attaching a raw film to a base film, the raw film comprising a synthetic resin and the base film including a main area and a peripheral area;
    forming a plurality of sprocket holes through the peripheral area of the base film and the raw film;
    forming a wiring pattern on the main area of the base film opposite the raw film;
    cutting the raw film along a boundary between the main area and the peripheral area of the base film; and removing a central portion of the raw film corresponding to the main area of the base film, whereby a remaining portion of the raw film reinforces the peripheral area of the base film.

11. A method of manufacturing a film carrier tape according to claim 10, wherein:
the raw film is attached to a lower surface of the base film and
the wiring pattern is formed on an upper surface of the base film.

12. A method of manufacturing a film carrier tape according to claim 10; wherein:
the synthetic resin includes at least one substance selected from a group consisting of polyethylene terephthalate, liquid crystalline polymer, polytetrafluoroethylene, polypropylene, polyethylene, polyamide-66 and polycarbonate.

13. A method of manufacturing a film carrier tape according to claim 10, wherein:
the synthetic resin includes a major portion of polyethylene terephthalate.

14. A method of manufacturing a film carrier tape according to claim 10, wherein:
the wiring pattern is formed on the main area of the base film before the raw film is cut along the boundary between the main area and the peripheral area of the base film.

15. A method of manufacturing a film carrier tape according to claim 10, wherein:
the wiring pattern is formed on the main area of the base film after the raw film is cut along the boundary between the main area and the peripheral area of the base film.

16. A method of manufacturing film carrier tapes comprising:
attaching a raw film to a base film, the raw film comprising a synthetic resin and the base film having a plurality of main areas and a plurality of peripheral areas bounding the main areas;

forming a plurality of sprocket holes through the peripheral areas of the base film and the raw film;

forming a plurality of cuts through the raw film along a plurality of boundaries between the main areas and the peripheral areas of the base film;

forming a plurality of wiring patterns on the main areas of the base film opposite the raw film;

removing portions of the raw film from the main areas of the base film, whereby remaining portions of the raw film reinforce the peripheral areas of the base film.

17. A method of manufacturing film carrier tapes according to claim 16, wherein:
attaching the raw film to the base film includes forming an adhesive layer between a surface of the raw film and an opposing surface of the base film.

18. A method of manufacturing a film carrier tape according to claim 16, further comprising:
separating the base film along the peripheral areas to form a plurality of film carrier tapes.

* * * * *